US 6,648,092 B2

(12) United States Patent
Michaud et al.

(10) Patent No.: US 6,648,092 B2
(45) Date of Patent: Nov. 18, 2003

(54) HALL EFFECT SEAT SWITCH

(75) Inventors: Jan L. Michaud, Cuyahoga Falls, OH (US); Arthur J. Harvey, Mantua, OH (US)

(73) Assignee: Delta Systems, Inc., Streetsboro, OH (US)

( * ) Notice: Subject to any disclaimer, the term of this patent is extended or adjusted under 35 U.S.C. 154(b) by 0 days.

(21) Appl. No.: 10/194,120

(22) Filed: Jul. 12, 2002

(65) Prior Publication Data
US 2002/0175015 A1 Nov. 28, 2002

Related U.S. Application Data

(63) Continuation of application No. 09/586,865, filed on Jun. 5, 2000.

(51) Int. Cl.[7] .............................................. B60K 28/00
(52) U.S. Cl. ....................... 180/272; 180/273; 280/735; 200/85
(58) Field of Search .......................... 280/735; 180/272, 180/273; 340/666, 667; 335/205; 177/210; 200/85, 506

(56) References Cited

U.S. PATENT DOCUMENTS

| 3,829,803 | A | | 8/1974 | Maeda |
| 4,354,562 | A | | 10/1982 | Newman |
| 4,738,325 | A | | 4/1988 | Bullivant et al. |
| 4,795,865 | A | | 1/1989 | Howard |
| 5,170,313 | A | * | 12/1992 | Miller et al. ................. 361/179 |
| 5,190,019 | A | | 3/1993 | Harvey |
| 5,303,012 | A | * | 4/1994 | Horlacher et al. .......... 335/253 |
| 5,394,678 | A | | 3/1995 | Lonn et al. |
| 5,424,502 | A | | 6/1995 | Williams |
| 5,481,078 | A | | 1/1996 | Asche |
| 5,548,888 | A | | 8/1996 | Williams |
| 5,565,829 | A | | 10/1996 | Loraas et al. |
| 5,657,224 | A | | 8/1997 | Lonn et al. |
| 5,678,854 | A | | 10/1997 | Meister et al. |
| 5,812,052 | A | | 9/1998 | Swanger et al. |
| 5,868,243 | A | | 2/1999 | Bachle |
| 5,907,892 | A | * | 6/1999 | Todd ............................ 24/642 |
| 5,931,254 | A | | 8/1999 | Loraas et al. |
| 5,966,784 | A | * | 10/1999 | Arbogast et al. ............. 24/633 |
| 6,062,501 | A | * | 5/2000 | Halvarsson ............... 242/364.8 |
| 6,097,272 | A | | 8/2000 | Grover et al. |
| 6,129,168 | A | | 10/2000 | Lotito et al. |
| 6,166,339 | A | | 12/2000 | Bechis |
| 6,205,629 | B1 | * | 3/2001 | Becker ......................... 24/633 |
| 6,207,910 | B1 | | 3/2001 | Harvey et al. |
| 6,357,091 | B1 | * | 3/2002 | Devereaux .................... 24/633 |
| 6,457,545 | B1 | * | 10/2002 | Michaud et al. ............. 180/272 |

* cited by examiner

Primary Examiner—Paul N. Dickson
Assistant Examiner—Toan C To
(74) Attorney, Agent, or Firm—Watts, Hoffmann, Fisher & Heinke Co., L.P.A.

(57) ABSTRACT

A Hall effect safety switch assembly for de-activating a motor vehicle if a user is not positioned on a vehicle seat. The assembly includes a switch frame for mounting the assembly, a magnet and a hall effect sensor mounted to the switch frame in a spaced apart relationship, and a vane that moves in response to the presence of a vehicle operator on the seat that causes the Hall effect sensor to provide an inhibit signal that prevents an engine from running.

6 Claims, 7 Drawing Sheets

HALL EFFECT SEAT SWITCH

This is a continuation application Ser. No. 09/586,865, filed on Jun. 5, 2000.

FIELD OF THE INVENTION

The present invention relates to a seat switch for use in a vehicle and, more particularly, the present invention relates to a seat switch that senses the presence of an operator in a vehicle.

BACKGROUND OF THE INVENTION

It is common in the prior art to equip a vehicle with a seat switch that allows the operator's presence on the seat to be monitored. If the vehicle is running and the operator steps off the vehicle, there is a danger that the operator will be seriously injured. To reduce the hazard of such serious accidents, electrical circuits are used to disable the engine if the operator steps or falls from the vehicle.

One example of such a circuit is found in U.S. Pat. No. 5,190,019 to Harvey, which issued on Mar. 2, 1993. The '019 Harvey patent is assigned to the assignee of the present invention. The '019 Harvey patent discloses a seat switch that in combination with other switches forms a circuit that disables a magneto energized spark plug on a lawn or garden tractor to shut down an engine. The disclosure of the Harvey patent is incorporated herein by reference.

U.S. Pat. Nos. 4,795,865; 5,424,502 and 5,548,888, assigned to the assignee of the present invention, concern operator presence sensing on a vehicle having a seat. U.S. Pat. Nos. 4,795,865; 5,424,502 and 5,548,888 are incorporated herein by reference.

Hall effect devices in conjunction with magnets have been used in the past to detect the presence of an operator in a seat. For example, U.S. Pat. No. 5,481,078 shows a hall effect operator presence system for an operator seat that provides a signal to indicate when the seat is occupied. The operator's presence is sensed by permitting seat rails to pivot about a pivot point against leaf springs designed to support the operator's weight (plus a known factor of an operator's weight) so that the rear of the seat is raised when the seat is unoccupied. When an operator occupies the seat, the spring deflects and the rear of the seat moves down, resting on the seat support pan. An electronic sensor detects the seat position to provide a position signal.

U.S. Pat. No. 5,565,829 shows a Hall device used in conjunction with a magnet to monitor the presence of an operator in a seat. A hall effect sensor is mounted in a housing. The housing containing the hall effect sensor is mounted either to a base plate or a seat. A magnet is mounted to the other of the base plate or the seat. When an operator sits in the seat either the Hall effect sensor or the magnet is moved to cause the Hall effect sensor to generate a signal that indicates that an operator is present in the seat.

DISCLOSURE OF INVENTION

The present invention concerns a seat switch for controlling operation of a vehicle engine. The seat switch includes a switch frame, a magnet, a Hall effect sensor and a vane. The switch frame is adapted to be connected to the vehicle seat. The magnet, having an associated magnetic field, is mounted in the switch frame. The Hall effect sensor is mounted in the switch frame spaced apart from the magnet. The vane is movably connected to the switch frame and moves in response to an operator sitting on the vehicle seat. The vane moves from a first position that allows a magnetic field to be sensed by the Hall effect sensor to a second position that prevents the magnetic field from being sensed by the Hall effect sensor. When the vane is in one of the first or second positions a signal from the Hall effect sensor inhibits the vehicle engine from running. In one embodiment, if the operator leaves his or her seat, the seat switch deactivates the engine by allowing a magnetic field from the magnet to reach the Hall device by removing the vane from between the magnet and the Hall device. The Hall device produces an output signal that indicates that the operator is not in the vehicle seat and the engine is prevented from running.

A Hall effect seat switch constructed in accordance with the present invention is reliable and long lasting. The Hall effect seat switch does not include contacts that wear over time as they are engaged and disengaged. The Hall effect seat switch is adapted to be used on a wide array of vehicle seats, without requiring extensive modifications to the seat. The Hall effect seat switch of the present invention is especially well adapted for use on lawn and garden vehicles, such as riding lawn mowers. Because the design of the Hall effect seat switch allows it to be used on any vehicle seat, without requiring a great deal of modification to the seat, the Hall effect seat switch is also well suited for use on construction and agricultural vehicles.

Additional features of the invention will become apparent and a fuller understanding obtained by reading the following detailed description in connection with the accompanying drawings.

BEST MODE FOR PRACTICING THE INVENTION

Figure 1:
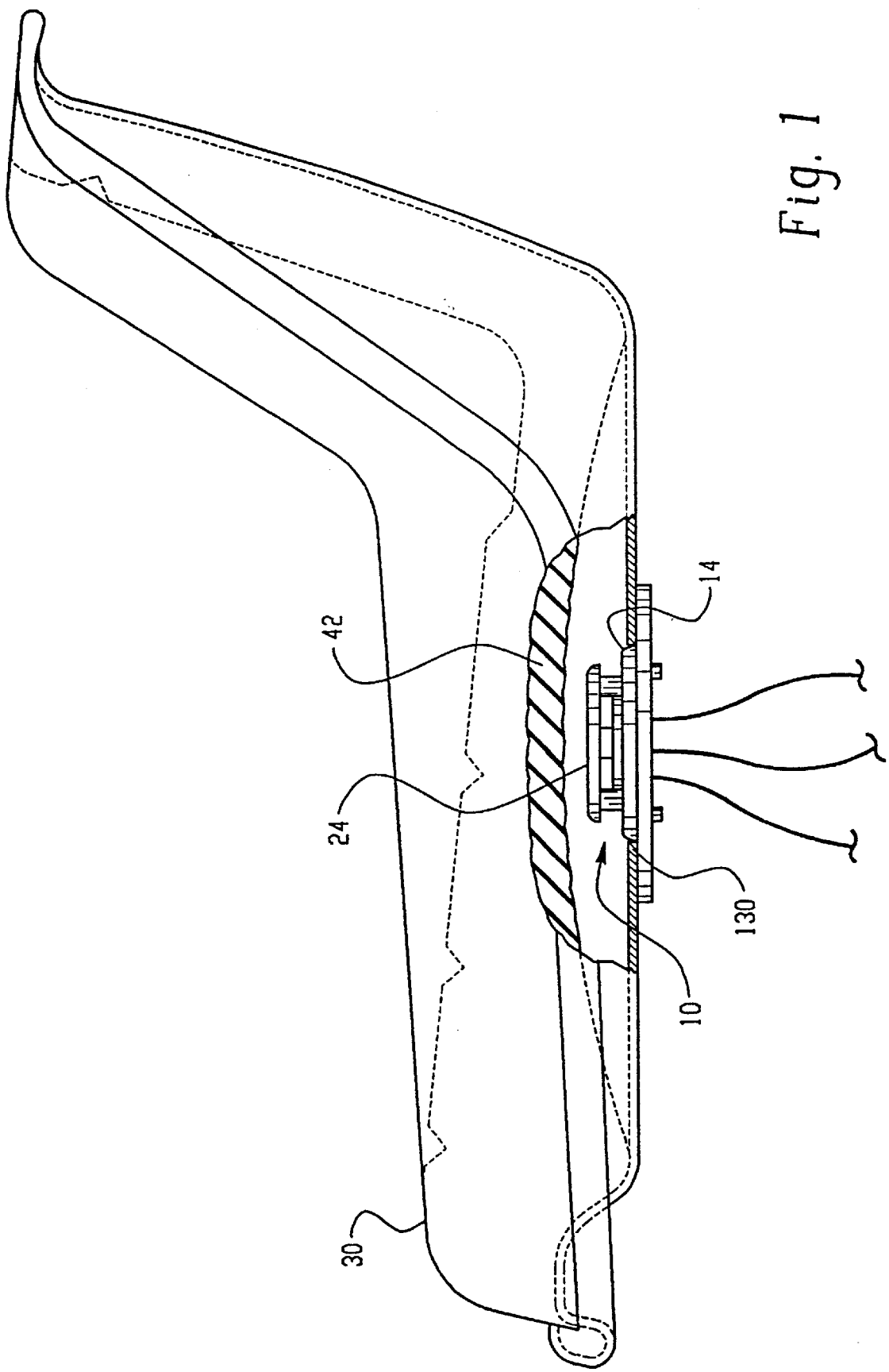
FIG. 1 is a side elevational view of the Hall effect seat switch of the present invention mounted in a vehicle seat.

The present invention is directed to a seat switch assembly 10 for controlling operation of a vehicle engine. The seat switch includes a switch frame 14, a Hall effect sensor 16 (FIGS. 4A & 4B), a magnet 18, a vane 20, a spring 22 and a cap 24. The switch frame is constructed so that it can easily be coupled to a vehicle seat 30. The Hall effect sensor 16 is mounted in the switch frame. A magnet 18 is also mounted in the switch frame 14 in a spaced apart relationship with the Hall effect sensor 16. The magnet 18 sets up an associated magnetic field that is communicated to the Hall effect sensor 16 when no obstructions are between the Hall effect sensor and the magnet.

The vane 20 (FIG. 2) is connected to the seat switch frame 14 in such a manner that is free to move. The vane 20 may be moved from a first position that allows the magnetic field to pass from the magnet 18 to the Hall effect sensor 16 to a second position, between the magnet and the Hall effect sensor, which prevents the magnet field from being sensed by the Hall effect sensor. The spring 22 connects the vane 20 to the switch frame 14. The spring 22 biases the vane 20 to a position that allows sufficient magnetic field to be communicated from the magnet to the Hall effect sensor 16 to maintain the Hall effect output in a first state. When the vane occupies an area between the Hall effect sensor and the magnet, the Hall effect sensor 16 changes state and provides a signal that allows the engine to run.

The cap 24 is movably connected to the switch frame 14. The cap 24 is pushed down by the seat 30 when the operator of the vehicle sits on the seat. When the cap 24 is pushed down, the cap 24 engages the vane 20 to move the vane 20 into a region between the magnet 18 and the Hall effect sensor 16. The presence of an operator in the vehicle seat 30 and resulting presence of the vane 20 in a region between the Hall effect sensor 16 and the magnet 18 causes the Hall sensor to produce a signal that allows the engine to run.

Figure 3A:
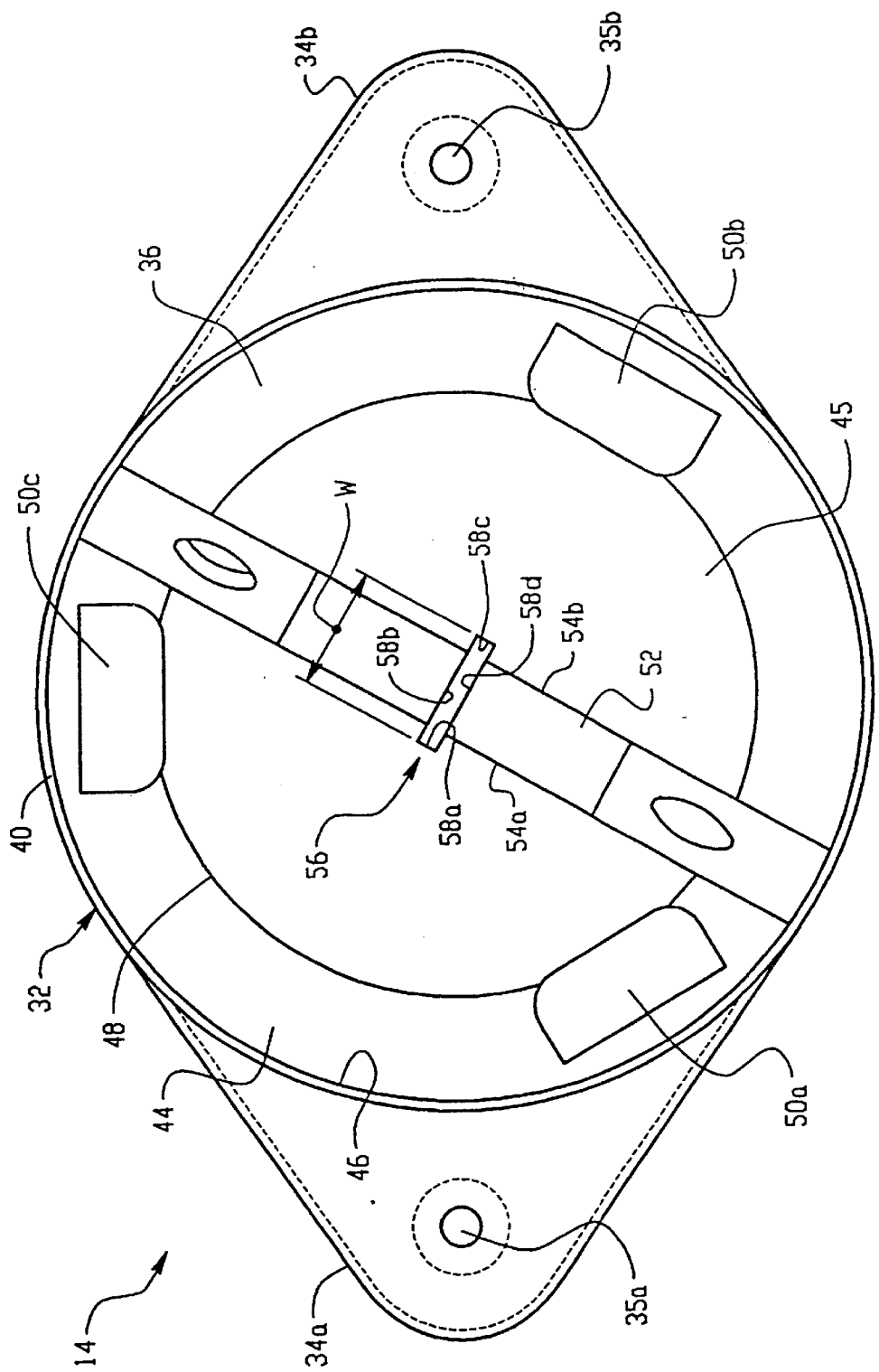
FIG. 3A is a top view of a Hall effect seat switch frame.
Figure 3B:
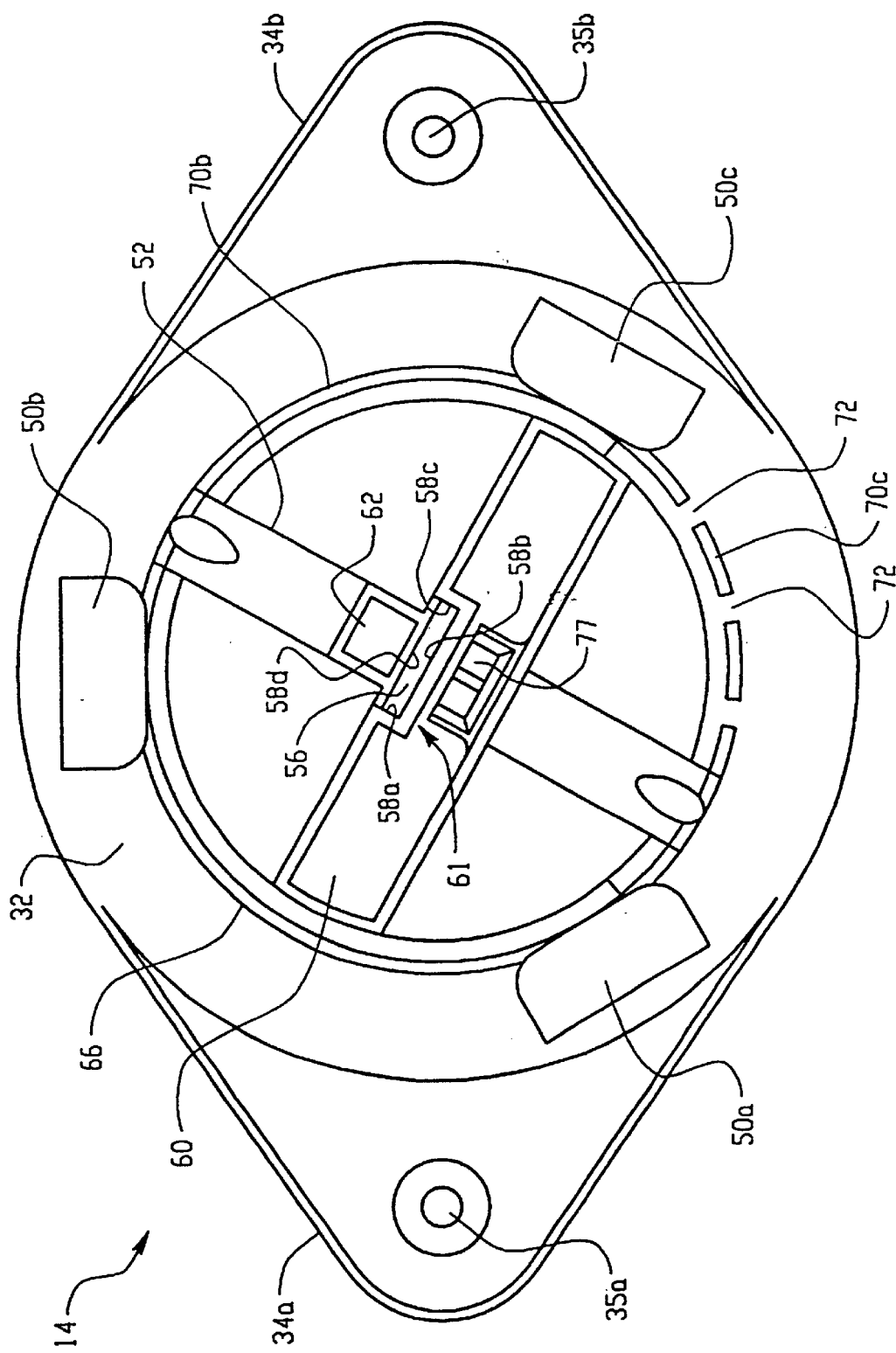
FIG. 3B is a bottom view of a Hall effect seat switch frame.

Referring to FIGS. 3A and 3B, the switch frame 14 is an integrally molded piece that connects the Hall effect seat switch to the vehicle seat 30. In the exemplary embodiment, the material molded to produce the switch frame is polypropylene. The switch frame 14 of FIG. 3A is sized to fit in an existing opening in a lawn and garden vehicle seat and has holes 35a,35b that align with existing mounting holes in a lawn and garden vehicle seat pan 130. The design of the switch frame also allows the seat switch 10 to be used on other construction and agriculture vehicles, because the switch frame 14 can be mounted to most seats without significant modification to the seat. In the exemplary embodiment, the switch frame 14 has the same footprint as the seat switch disclosed by the U.S. Pat. No. 4,795,865.

The switch frame 14 is defined by a large circular base portion 32 with two flanges 34a, 34b. Referring to FIG. 3A, the top side of the circular base portion 32 includes a circular recess 36. The circular recess 36 is sized so that an outer edge 38 of the cap 24 fits within the circular recess 36, when the cap 24 is depressed. Radially outward of the circular recess 36, a narrow ridge 40 is defined about the circumference of the circular base portion 32. The narrow ridge 40 fits within an opening extending through a seat pan 130 to locate the seat switch 10 relative to a seat cushion 42.

Figure 3C:
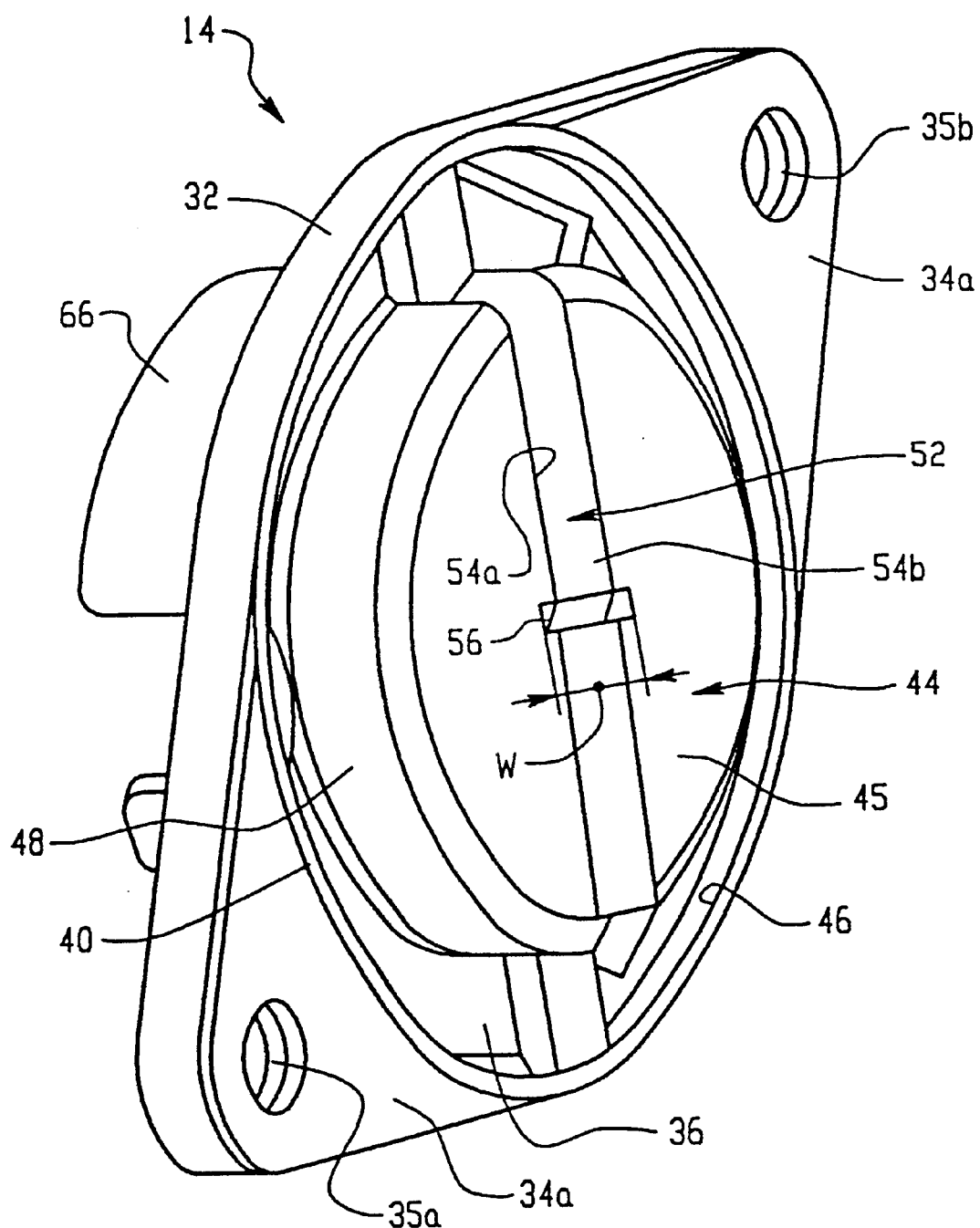
FIG. 3C is a perspective view of a Hall effect seat switch frame.

Referring to FIG. 3c, radially inward from the circular recess 36 is a central hub portion 44. The central hub portion 44 is a circular projection that extends from the-center of the circular base portion 32. The top surface 45 of the central hub portion is flat. The top surface 45 in conjunction with the circular recess 36 act as a stop that prevents the cap from damaging the spring 20 and vane 22. An outer wall 48 of the central hub portion and an inner wall 46 of the narrow ridge define the inner and outer boundaries of the circular recess 36. A channel 52 extends through the center of the central hub 44. The channel 52 defines a path that ends 23a,23b of the spring 22 slide against as the spring 22 is depressed and released. The central hub channel 52 includes two side walls 54a, 54b constrain the spring 22.

The circular base portion 32 includes three cap mounting holes 50 in the area of the circular recess 36. The three cap mounting holes 50 are equally spaced about the periphery of the central hub portion 44. The three cap mounting holes 50 are generally rectangular in shape, each having two rounded corners that are closest to the central hub portion.

The flanges 34a, 34b extend outward from the circular base portion 32. The flanges 34a, 34b are generally triangular in shape with rounded ends. Each radially extending flange 34a, 34b includes a corresponding opening 35a, 35b for attachment-to the vehicle seat pan with appropriate threaded fasteners.

Referring now to FIGS. 3B and 3C, a vane slot 56 extends through the switch frame 14 in the center of the hub 44. The slot 56 is perpendicular to the channel 52 and is located in the middle of the channel. Inner walls 58a,58b,58c,58d of the slot define the range of motion of the vane 20. The widths w of elongated walls 58b and 58d are reduced near the top surface 45 of the central hub portion 44 to prevent the flat end 112 of the vane 20 from being pulled through the top of the central hub portion 44.

A Hall effect compartment 60 and a magnet compartment 62 are located beneath the hub portion 44. The Hall effect compartment 60 is generally perpendicular to the channel 52 and extends across the width of the central hub portion 44. The Hall effect compartment 60 has a notch 61, so that the general shape of the Hall effect compartment is a "C." The notch 61 of the Hall effect compartment 60 surrounds the vane slot 56 on three sides. The Hall effect compartment 60 is large enough to accommodate the Hall effect sensor 16 and all the associated circuitry mounted on a printed circuit board.

Referring to FIG. 3B, the magnet compartment 62 is a small rectangular shaped compartment, having four sides, that is large enough to accommodate a small magnet 18. the magnet compartment 62 is generally aligned with the channel 52 and is approximately the same width as the channel 52. The magnet compartment 62 is spaced apart from the Hall effect compartment 60 by the vane slot 56. The fourth wall 58d of the vane slot 56 defines the side of the magnet compartment 62 that faces the Hall effect compartment 60.

Figure 2:
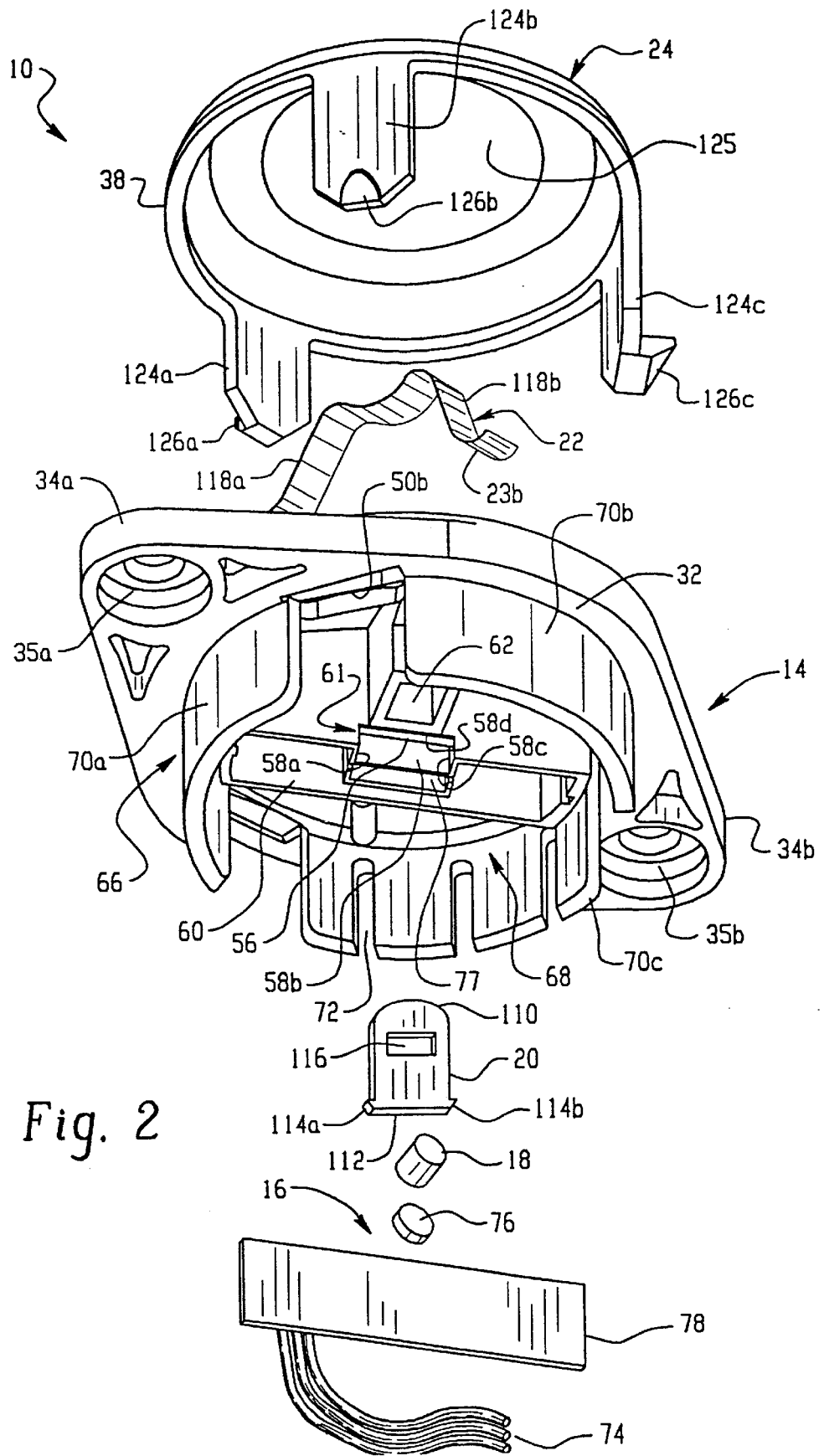
FIG. 2 is an exploded perspective view of the Hall effect seat switch.

Referring to FIG. 2, a circular wall 66 extends from the bottom 68 of the circular base portion. The circular wall 66 has cut-outs where the three cap mounting holes 50 extend through the switch frame 14 and therefore define three circular wall sections 70a, 70b, 70c. One of the circular wall sections 70c includes notches 72 for routing wires 74 that are connected to the Hall effect electronics. The notches 72 act as a strain relief for the wires 74.

The Hall effect sensor 16 includes a Hall effect device and associated circuitry mounted on a PC board 78. One Hall effect device that can be used is Melexis part number 5881KSO. The PC board 78 is mounted in the Hall effect compartment 60.

A flux director 76 may also be mounted in the Hall effect compartment 60 in a vacant area adjacent to the vane slot 56. In the exemplary embodiment, the flux director is positioned behind the Hall device in a small compartment 77 in the Hall effect compartment 60, so that the Hall device is located between the flux director 76 and the magnet 18. The flux director 76 is a ferrous metal slug that concentrates flux lines of the magnetic field on the Hall effect sensor 16.

Wires 74 that form input and output connections extend from the PC board 78 out of the Hall effect compartment 60. After the PC board 78 and flux director 76 are installed in the Hall effect compartment 60, the Hall effect compartment 60 is potted to prevent moisture from reaching the circuitry mounted to the printed circuit board 78.

Figure 5:
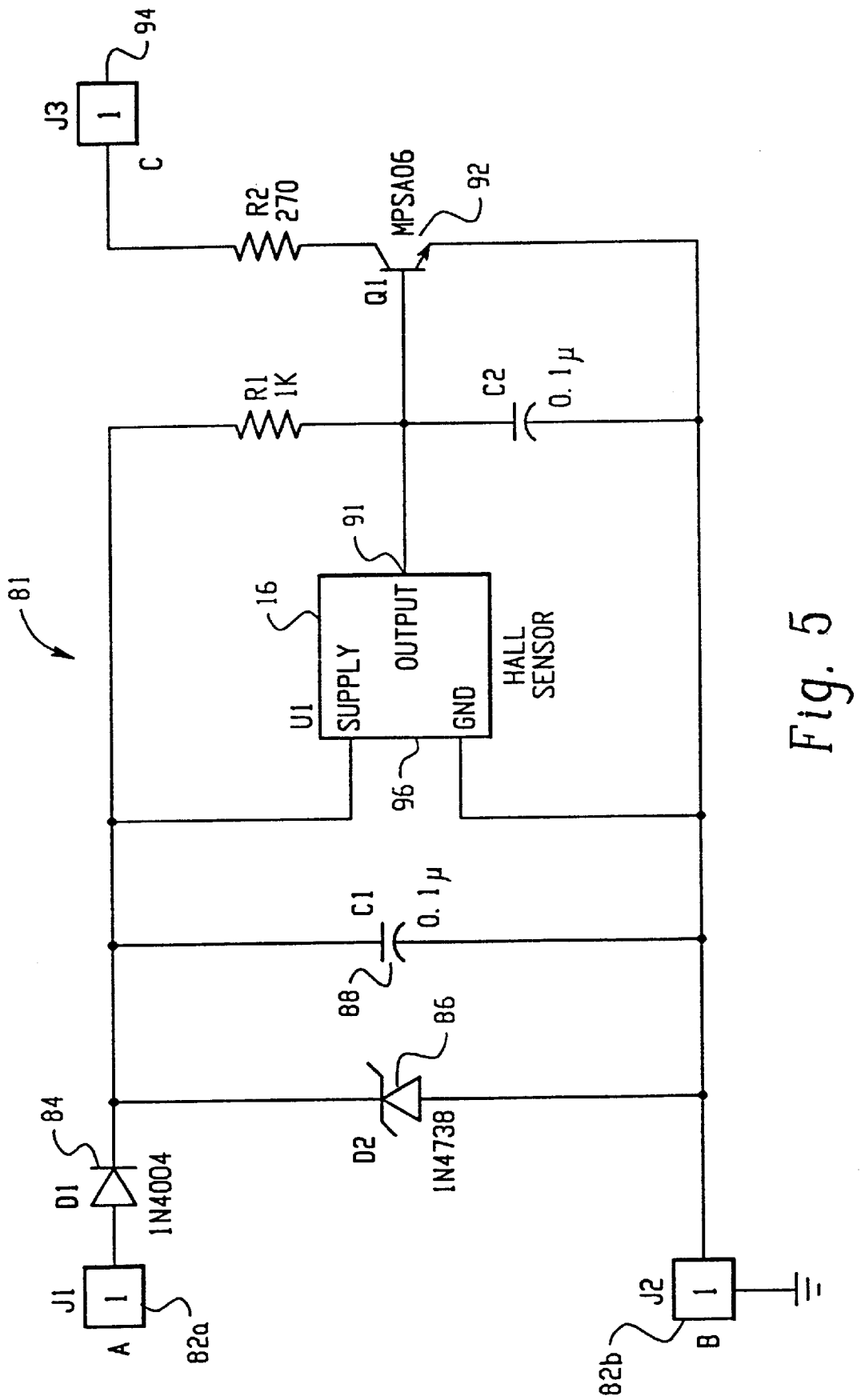

Referring to FIG. 5, the Hall effect circuitry 81 mounted on the printed circuit board includes two input connections 82a, 82b, a reverse polarity diode 84, a voltage limiting diode 86, a filtering capacitor 88, a Hall sensor 16, a transistor 92 and an output connection 94. The first input connection 82a is connected to a voltage source that provides a voltage, ranging from eight to sixteen volts. The second input connection 82*b* is connected to ground. The reverse polarity diode 84 is connected in series with the input connection 82*a* to prevent damage to the circuit in the event a the voltage source is connected to the wrong input connection. The voltage limiting diode 86 is connected in parallel with the voltage source. In the exemplary embodiment, the voltage limiting diode 86 is an eighteen volt zener diode. The filtering capacitor 88 is connected in parallel with the voltage limiting diode 86. The capacitor 88 filters noise from the input of the circuit. In the exemplary embodiment the filtering capacitor 88 is a one micro-farad capacitor. The input 96 of the Hall device 16 is connected in parallel with the voltage limiting diode 86 and the capacitor 88, so that the hall device is supplied with the voltage maintained by the voltage limiting diode. An output 91 from the Hall device 16 is connected to a base input 93 of the transistor 92 that is connected to the output connection 94.

A small permanent magnet 18 is placed in the magnet compartment 62. After the magnet is placed in the magnet compartment 62, the magnet compartment 62 is potted. Once installed, the magnet 18 is spaced apart from the Hall effect sensor 16 by the vane slot 56. When no obstructions are present between the Hall effect sensor 16 and the magnet 18 the magnetic field passes through the vane slot to the Hall sensor 16.

The vane 20 is a thin, relatively planar member with a rounded end 110 and a flat end 112 (See FIG. 2). The vane is made from a ferromagnetic material. In the exemplary embodiment, the vane is made from 0.050 inch thick plated steel. The dimensions of the vane 20 are slightly smaller than the dimensions of the vane slot 56, so that the vane 20 is free to slide within the slot. The flat end 112 of the vane 20 includes two nubs 114*a*, 114*b* that extend outward. The two small nubs 114*a*, 114*b* prevent the vane 20 from being pulled completely through the slot 56 when the vane 20 is inserted into the slot from the bottom 68 of the circular base portion. At an end of travel position, the two small nubs 114*a*, 114*b* bottom out against short slot walls 58*a* and 58*c*, where the width w of elongated slot walls 58*b* and 58*d* is reduced. Near the rounded end 110 is a rectangular cutout 116 for attachment to the spring 22. The cutout 116 is larger than the flat form spring 22, making assembly of the spring 22 to the vane 20 easier.

The spring 22 is a flat form spring that has the generally shape of an "M". In the exemplary embodiment, the spring 22 is made from a 0.250 inch wide strip of 0.012 inch thick stainless steel. The formed spring is between 1.445 and 1.465 inches wide and between 0.675 and 0.690 inches tall. As the spring 22 is depressed, two legs 118*a*, 118*b* are forced outwardly reducing the height of the spring 22 (FIG. 4B). Ends 23*a*, 23*b* of the legs are curved, so that the legs can easily slide along the channel 52.

Referring to FIG. 2, the vane 20 and spring 22 are connected to the switch frame 14 by inserting the vane 20 into the vane slot 56 from the bottom 68 of the circular base portion. The vane 20 is then pushed up through the vane slot, so that the rectangular cut-out 116 extends through the central hub 44. The spring 22 is depressed and slid along the length of the channel 52 through the rectangular cut-out 116 of the vane 20 until the middle of the spring 22 is aligned with the vane 20. The spring is released and the upward force of the spring pulls the vane up and holds it in place. The side walls 54*a*, 54*b* of the channel 52 constrain sides 120*a*, 120*b* of the spring 22, allowing the spring 22 to only move along the length of the channel 52.

Once the spring 22 has been inserted into the rectangular cut-out 116 of the vane 20, the vane 20 is prevented from being pulled out of the bottom of the vane slot 56 by the spring 22. The spring 22 and vane 20 are prevented from being pulled from the top of the switch frame by the two nubs 114*a*, 114*b* that bottom out on the walls 58 of the slot 56 before reaching the top of the slot.

Figure 4A:
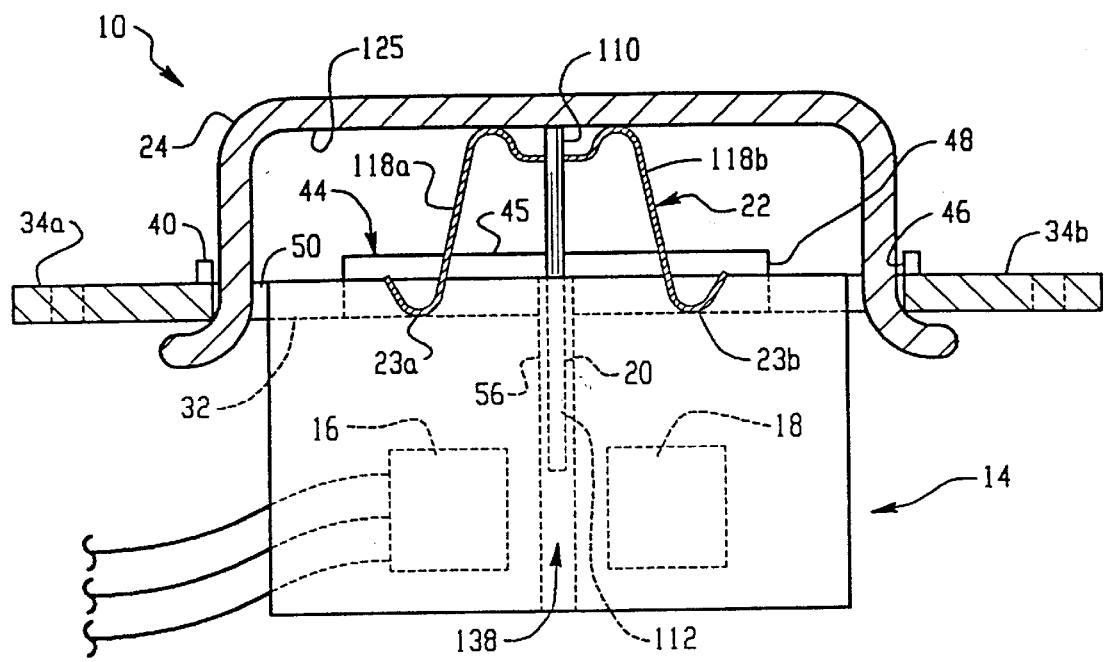
FIG. 4A is a schematic representation of the Hall effect seat switch in an up position.
Figure 4B:
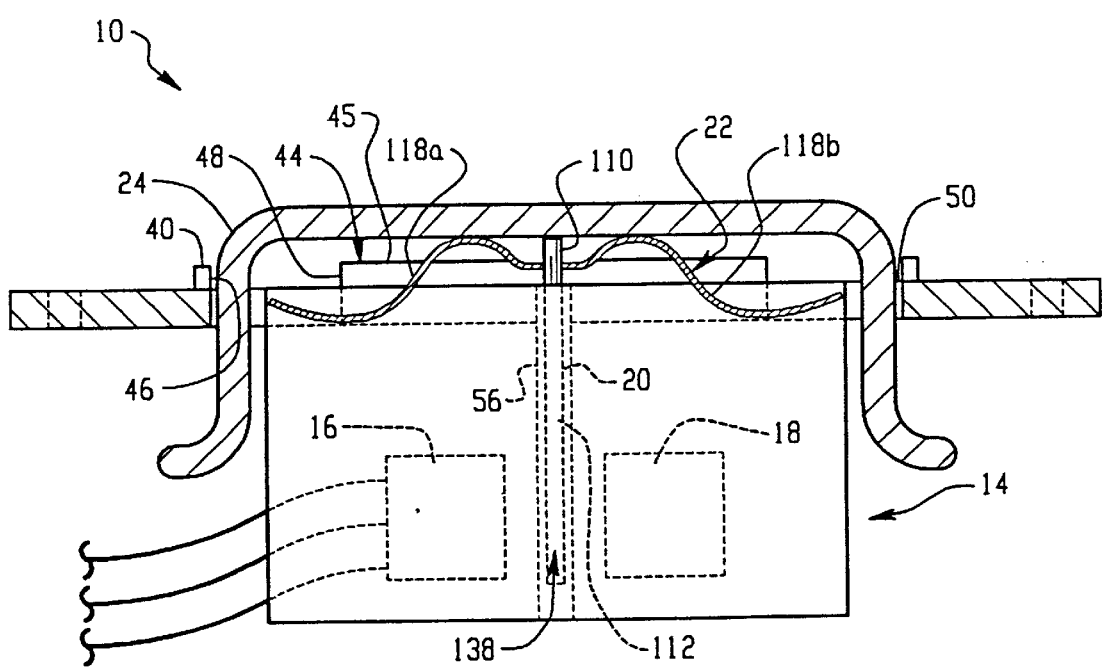
FIG. 4B is a schematic representation of the Hall effect seat switch in a down position; and, FIG. 5 is a schematic representation of the circuitry of the Hall effect seat switch.

As is best shown in FIGS. 4A and 4B, the spring 22 biases the vane 20 such that the flat end 112 of the vane 20 is normally above the Hall effect sensor 16 and the magnet 18. When pressure is applied to the round end 110 of the vane by the cap 24, the vane is pushed down in the vane slot 56 and occupies the space between the magnet 18 and the Hall device, impeding the magnetic field from being communicated from the magnet 18 to the Hall device.

As is seen in FIG. 2, the cap is an integrally molded piece. The cap 24 provides a large interface area for the seat to interface with and covers the vane 20 and spring 22. The cap 24 includes a cover 122 that has three integral flexible legs 124*a*, 124*b*, 124*c* that connect the cap 24 to the switch frame 14. The bottom 125 of the caps large cover 122 transfers force applied to it by the seat cushion to the rounded end 110 of the vane 20. The three legs 124*a*, 124*b*, 124*c* have flanged ends 126*a*, 126*b*, 126*c* that fit through the three cap mounting holes 50 to connect the cap 24 to the switch frame 14. The legs 124*a*, 124*b*, 124*c* are flexed inward as the flanged ends 126*a*, 126*b*, 126*c* are pushed through the cap mounting holes 50. In an unflexed position, the legs 124*a*, 124*b*, 124*c* are generally perpendicular to the cover 122, so that once the legs 124*a*, 124*b*, 124*c* are flexed inward and pushed into the mounting holes 50, they return to their original shape. An outwardly facing portion of the flanged ends 126*a*, 126*b*, 126*c* overlaps the bottom surface of the switch frame 14 to retain the cap 24 and limit its movement away from the switch frame 14. With the cap 24 mounted to the switch frame 14, a downward facing lip or edge 128 is positioned above the circular recess 36 in the switch frame 14.

To implement the seat switch 10, it is attached to the bottom surface of the seat pan 130 by suitable threaded connectors extending through two openings 35*a*, 35*b* in the switch frame flanges 34*a*, 34*b*. With the seat switch 10 mounted to the pan 130, the cap 24 coupled to the switch frame 14 passes through a circular opening created in the pan. When the seat is unoccupied, a cushion 42 defines a generally concave lower surface 136 that leaves the cap 24 in a raised position.

Referring to FIG. 4A, when an operator is not present in the vehicle seat, the vane 20 is biased out of a region 138 between the magnet 18 and the Hall device 16 by the spring 22. The biased position 26 is maintained by the upward force of the spring, which pulls the vane 20 up until the nubs 114*a*,114*b* engage the short vane walls 58*a*,58*c* where the width w of elongated vane walls 58*b*, 58*d* is reduced. This reduced width is produced during the molding process of the walls. The magnetic field of the magnet 18 is communicated to the Hall sensor 16. When the magnetic field of the magnet 18 is sensed by the Hall sensor 16, the output of the Hall sensor 16 is low. When the output of the Hall sensor 98 is low, the transistor 92 is turned OFF. When the output of the transistor 92 is OFF, the output 94 is externally pulled-up with a resistor to HIGH (5 volts). The HIGH output is used to prevent the engine from running. The HIGH signal is provided to a circuit that shuts down the engine. Circuits that shut down vehicle engines are known in the art. For example, U.S. Pat. No. 5,190,019 to Harvey discloses a safety circuit coupled to an ignition circuit and a magneto coil for disabling an engine that powers a riding lawn mower.

Referring to FIG. 4B, when a vehicle operator is seated on the seat 30, the weight of the operator deforms the cushion 42 causing the cushion to engage and depress the cap 24 to the second position 28. As the vane 20 is forced down, the spring legs 118a,118b are forced outward along the path defined by the side walls 54a,54b of the channel 52. When the vane 20 is moved down in the vane slot 56, it occupies the region 138 between the Hall effect sensor 16 and the magnet 18. When the vane 20 is in the DOWN position between the Hall sensor 16 and the magnet 18, the magnetic field of the magnet 18 in the region of the Hall sensor 16 is reduced. When the magnetic field of the magnet 18 is thus reduced by the presence of the vane 20, the output 91 of the Hall sensor 16 switches to high. When the output 91 of the Hall sensor 16 is high, the transistor 92 is turned ON. When the transistor 92 is turned ON, the output 94 is low (0 volts). The output is connected to a circuit that allows the engine to run when the output 94 is low.

It should be readily apparent to those skilled in the art that the circuitry of the Hall effect seat switch can be adjusted to produce outputs other than has been specifically disclosed. For example, the output 94 may be reversed such that it is HIGH (5 volts) when an operator is present in the seat and LOW (0 volts) when the seat is vacant. It should also be apparent that the output of the Hall effect seat switch of the present invention may be reversed, so that the output of the Hall effect seat switch in the "up" position allows the engine to run and the output of the Hall effect seat switch in the down position kills the engine.

The operator can shift his or her weight in the seat and still maintain the vane 20 depressed within the vane slot 56, a sufficient amount to allow continued vehicle operation. If, however, the operator steps from, or is thrown from the seat 30, the spring 22 moves the vane 20 from between the Hall effect sensor 16 and the magnet 18 to provide an output that kills the engine.

Although the present invention has been described with a degree of particularity, it is the intent that the invention include all modifications and alternations falling within the spirit or scope of the appended claims.

We claim:

1. A hall effect switch comprising:
    a) a switch frame;
    b) a magnet mounted in said switch frame, said magnet having an associated magnetic field;
    c) a hall effect sensor mounted in said switch frame spaced apart from said magnet; and
    d) a vane movably connected to said switch frame, said vane being movable from a first position that inhibits said magnetic field from being sensed by said hall effect sensor between said magnet and said hall effect sensor to a second position that allows said magnetic field to be sensed by said hall effect sensor at least partially removed from between said magnet and said hall sensor wherein at least one of said first and second positions of said vane causes said hall effect sensor to provide a signal that is indicative of the position of the vane.

2. The apparatus of claim 1 further comprising a spring operably connected to the vane to bias the vane to one of said first and second positions.

3. A method of sensing and communicating a condition of a switch, comprising:
    a) communicating a magnetic field from a magnet that is spaced apart from a hall device to said hall device;
    b) moving a vane to a first position that inhibits said magnetic field from being sensed by said hall device between said magnet and hall device;
    c) moving the vane to a second position that allows said magnetic field to be sensed by said hall device removed from between said magnet and said hall device; and
    d) providing an output signal indicating that the magnetic field communicated to the hall device is altered.

4. The method of claim 3 further comprising biasing said vane to one of said first and second positions.

5. The method of claim 4 wherein a spring biases said vane to one of said first and second positions.

6. A method of sensing and communicating a position of a switch, comprising:
    a) biasing a vane to one of a first position in a region between a magnet and a hall device that inhibits a magnetic field from being sensed by the hall device and a second position at least partially out of said region between said magnet and said hall device that allows said magnetic field to be sensed by said hall device;
    b) moving said vane to one of said first position and said second position; and
    c) providing an output signal indicating that a magnetic field is being communicated to said hall device when said vane is in said second position.

* * * * *